United States Patent
Rawat et al.

(10) Patent No.: US 9,966,150 B2
(45) Date of Patent: May 8, 2018

(54) METHOD TO PROGRAM BITCELLS OF A ROM ARRAY

(71) Applicant: Synopsys, Inc., Mountain View, CA (US)

(72) Inventors: Anil Singh Rawat, Delhi (IN); Pritender Singh, Noida (IN)

(73) Assignee: Synopsys, Inc., Mountain View, CA (US)

( * ) Notice: Subject to any disclaimer, the term of this patent is extended or adjusted under 35 U.S.C. 154(b) by 0 days. days.

(21) Appl. No.: 15/215,371

(22) Filed: Jul. 20, 2016

(65) Prior Publication Data

US 2017/0025185 A1 Jan. 26, 2017

(30) Foreign Application Priority Data

Jul. 23, 2015 (EP) .................................. 15178040

(51) Int. Cl.
*G11C 17/00* (2006.01)
*G11C 17/12* (2006.01)
*G11C 17/10* (2006.01)
*G11C 17/18* (2006.01)
*G06F 17/50* (2006.01)
*H01L 27/112* (2006.01)

(52) U.S. Cl.
CPC .......... *G11C 17/12* (2013.01); *G06F 17/5045* (2013.01); *G11C 17/10* (2013.01); *G11C 17/123* (2013.01); *G11C 17/126* (2013.01); *G11C 17/18* (2013.01); *H01L 27/11213* (2013.01)

(58) Field of Classification Search
None
See application file for complete search history.

(56) References Cited

U.S. PATENT DOCUMENTS

| | | | |
|---|---|---|---|
| 7,002,827 B1 | 2/2006 | Sabharwal et al. | |
| 8,674,422 B2 | 3/2014 | Horch | |
| 8,853,761 B2 | 10/2014 | Horch | |
| 9,202,588 B1* | 12/2015 | Kohli | G11C 17/12 |
| 9,286,998 B1* | 3/2016 | Singh | G11C 11/5692 |
| 9,508,868 B2 | 11/2016 | Horch | |
| 2009/0193405 A1* | 7/2009 | Jiang | G06F 8/4442 |
| | | | 717/151 |
| 2015/0001603 A1 | 1/2015 | Horch | |

OTHER PUBLICATIONS

European Extended Search Report, European Application No. 15178040.0, dated Feb. 15, 2016, 9 pages.

* cited by examiner

*Primary Examiner* — Son Dinh
*Assistant Examiner* — Uyen B Tran
(74) *Attorney, Agent, or Firm* — Fenwick & West LLP

(57) ABSTRACT

A method to program bitcells of a ROM array uses different programming cells for programming the bitcells with a first or second data item. A first bitcell is programmed by means of a selected programming cell, wherein the programming cell is selected in dependence on operating the memory array as a flipped or a non-flipped memory in multi-bank instance. All other bitcells located in the same column as the first bitcell and subsequent rows are programmed by selected programming cells, wherein the selection of the programming cells is dependent on operating the memory array as a flipped or a non-flipped memory in multi-bank instance and the programming state of the programming cells used for the previously programmed bitcells in the same column.

25 Claims, 13 Drawing Sheets

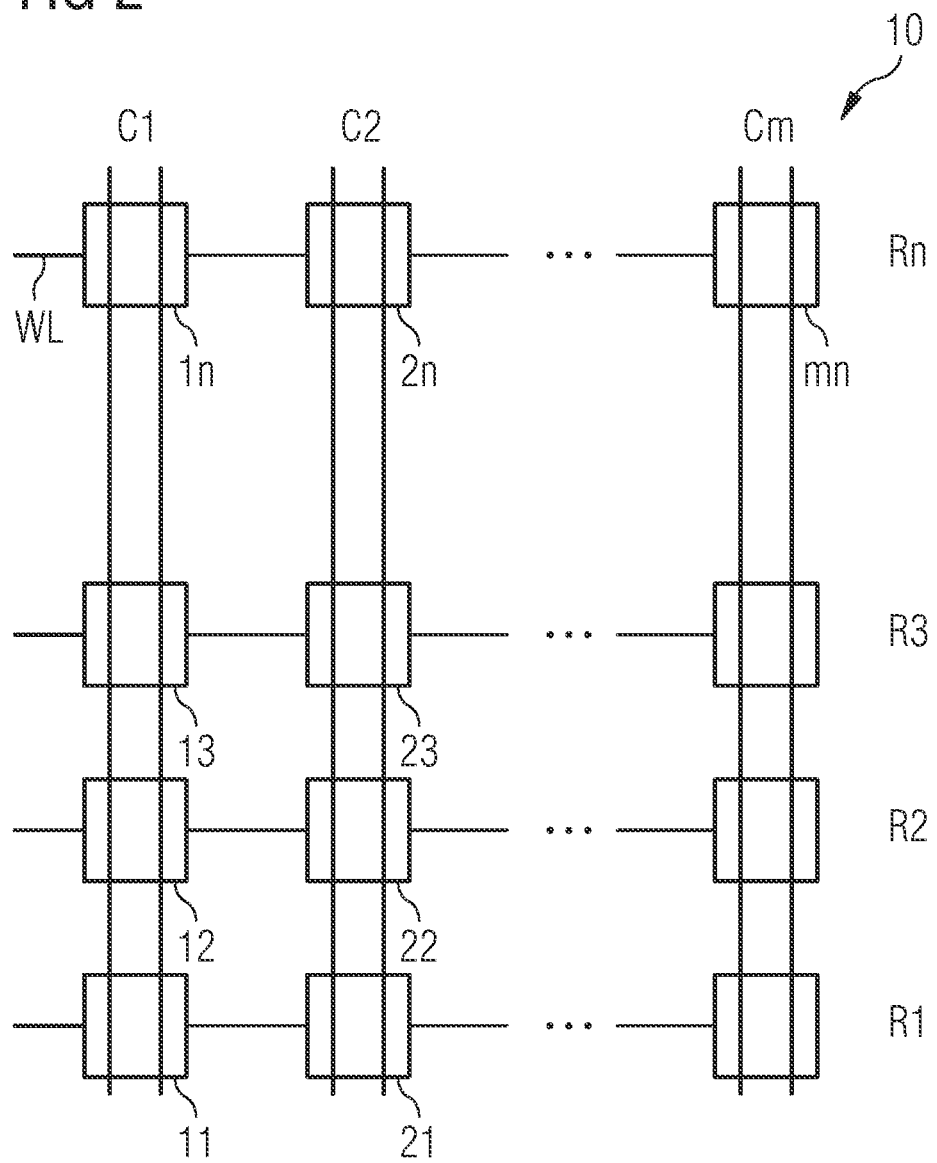

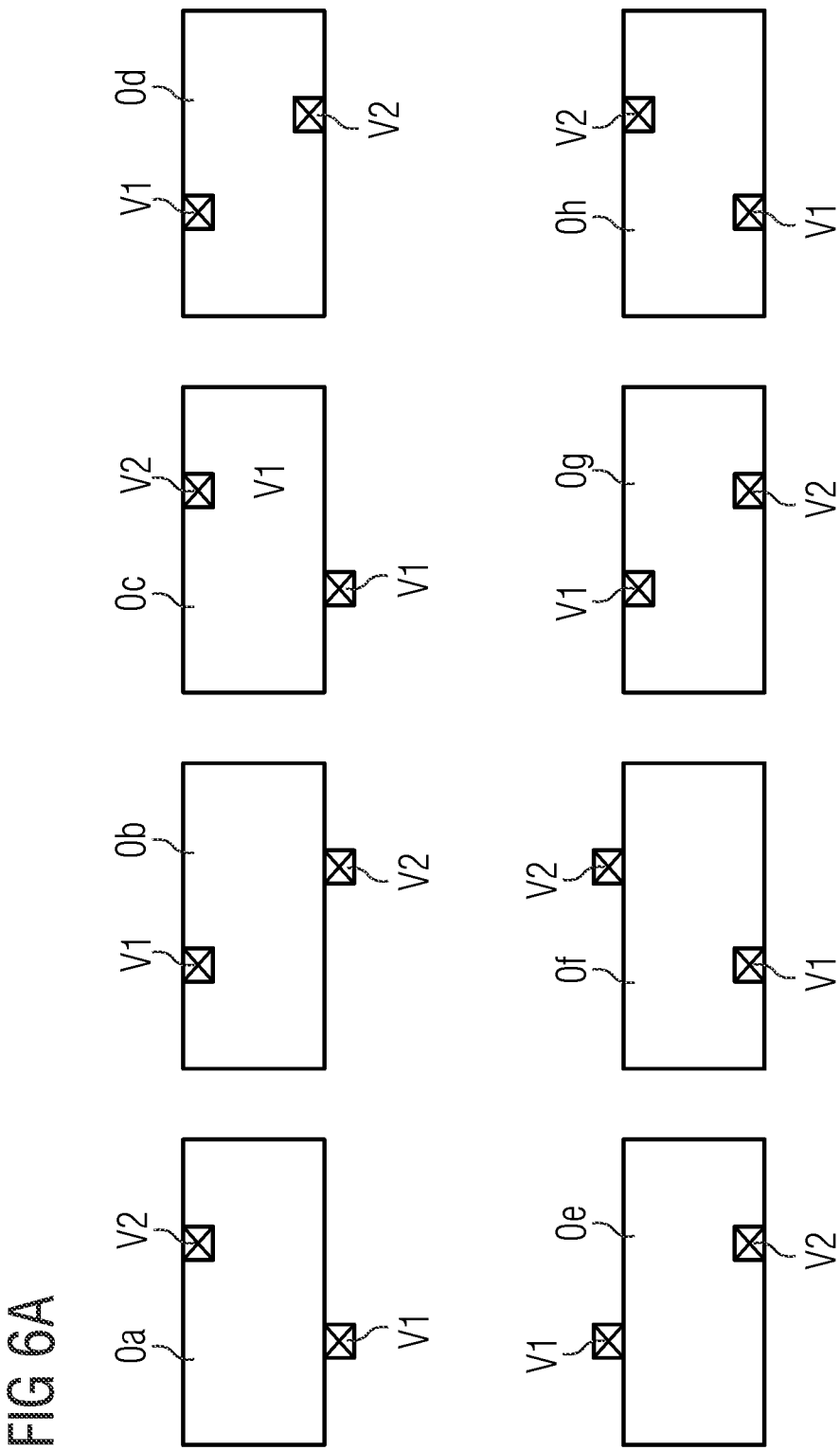

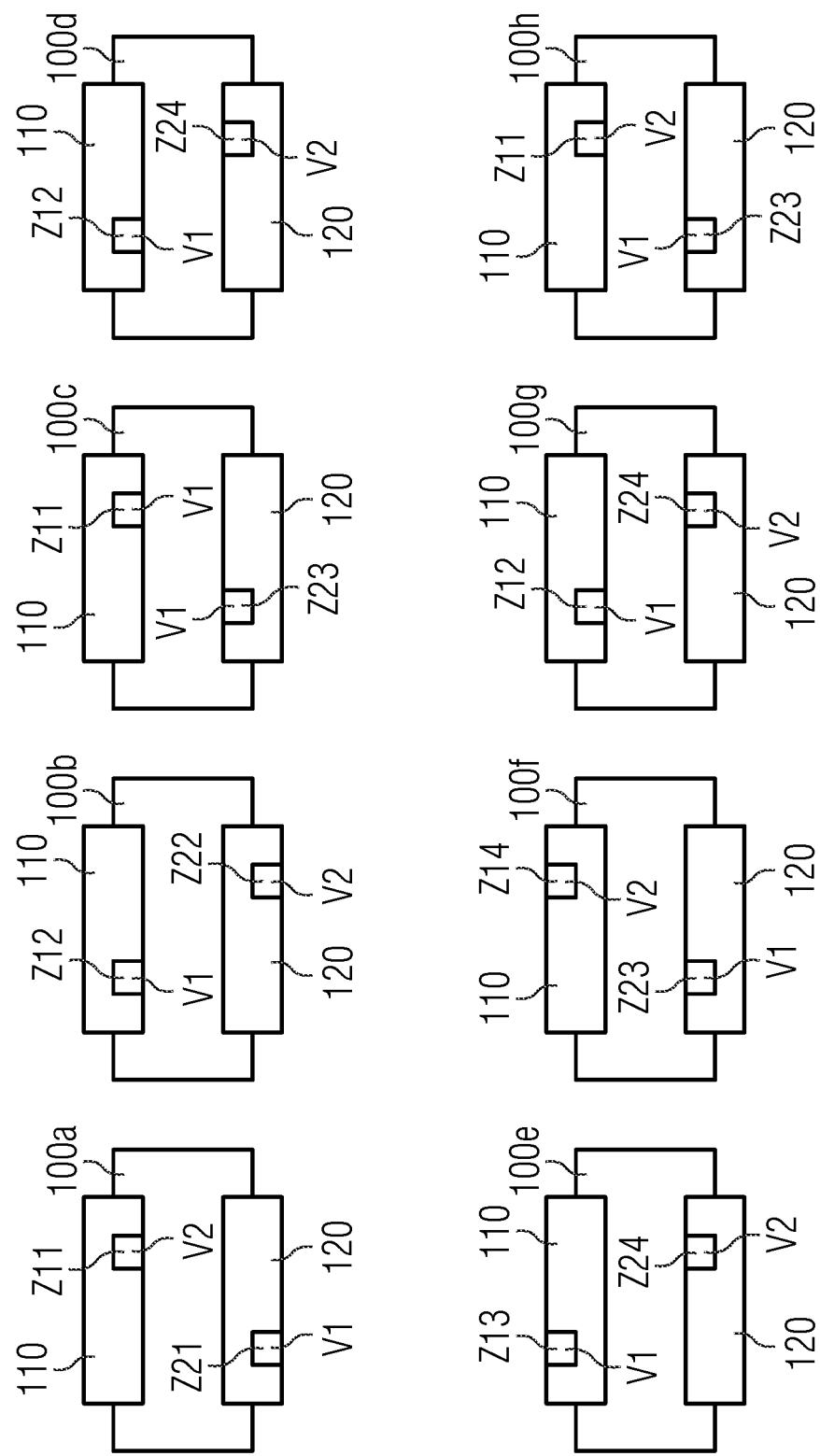

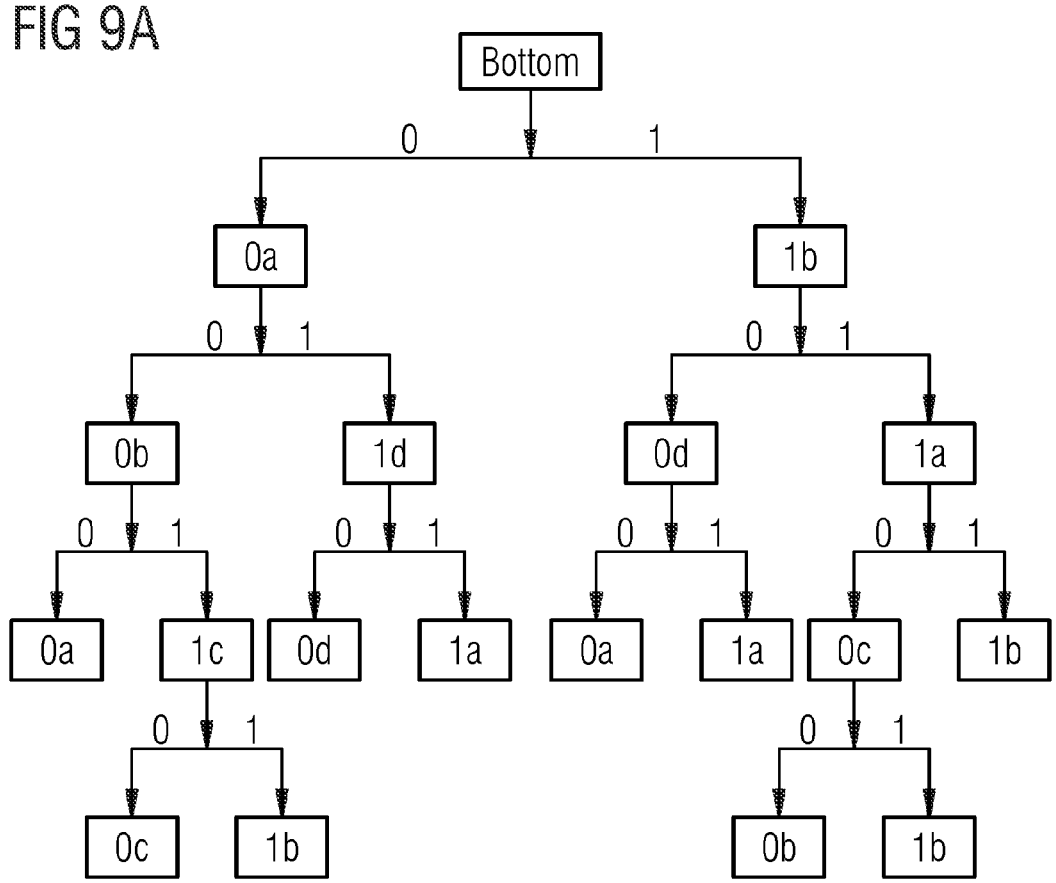

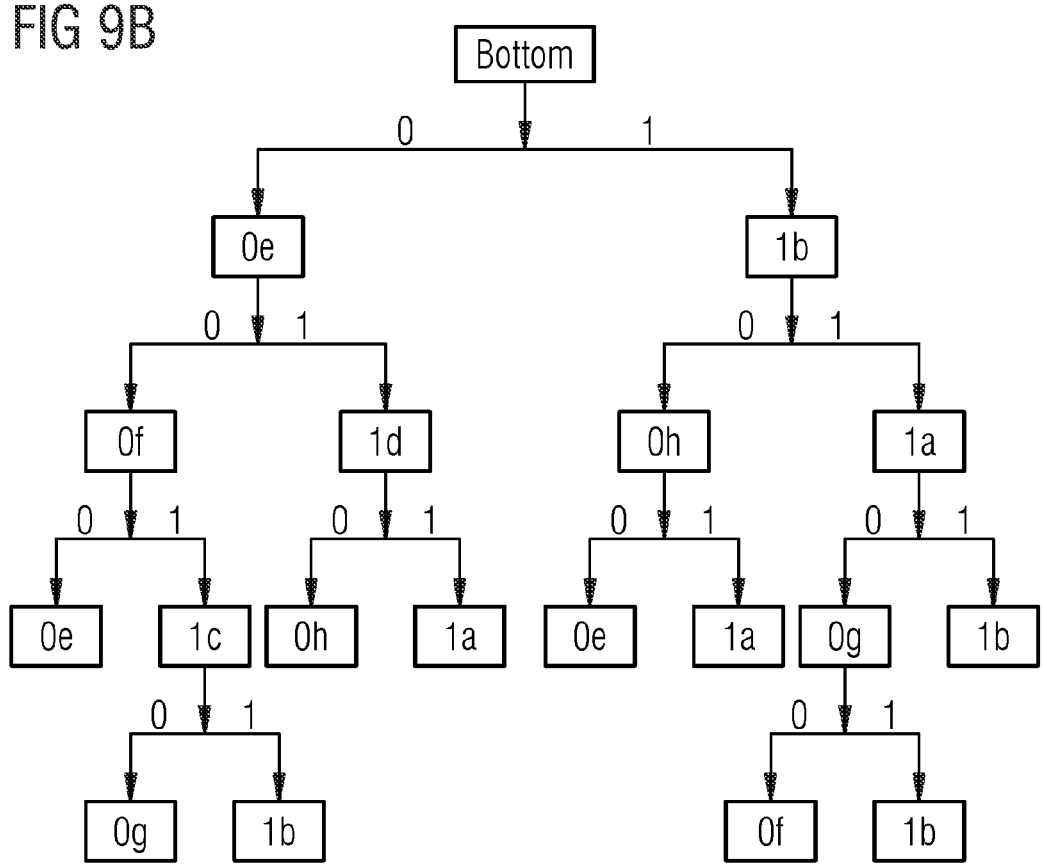

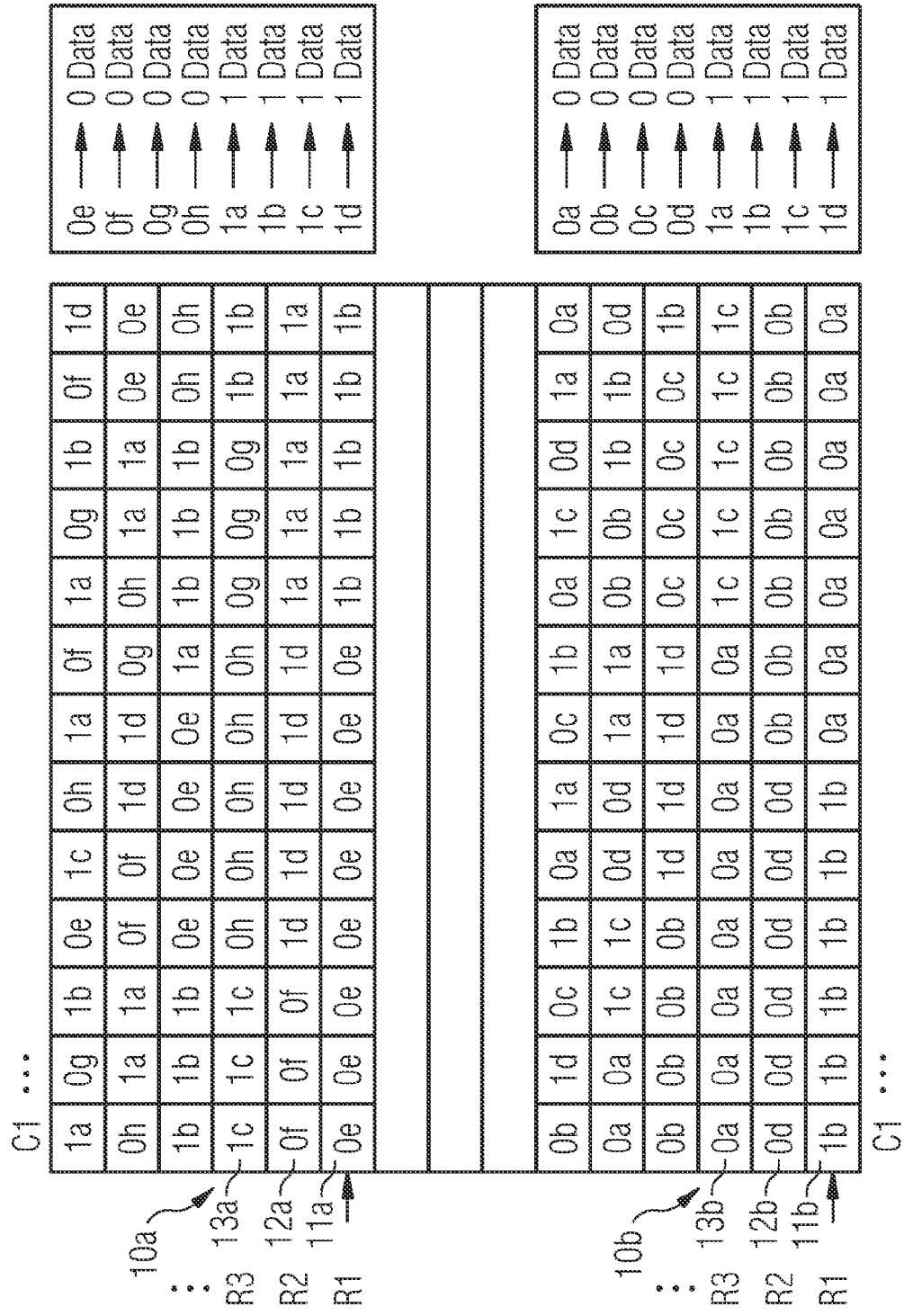

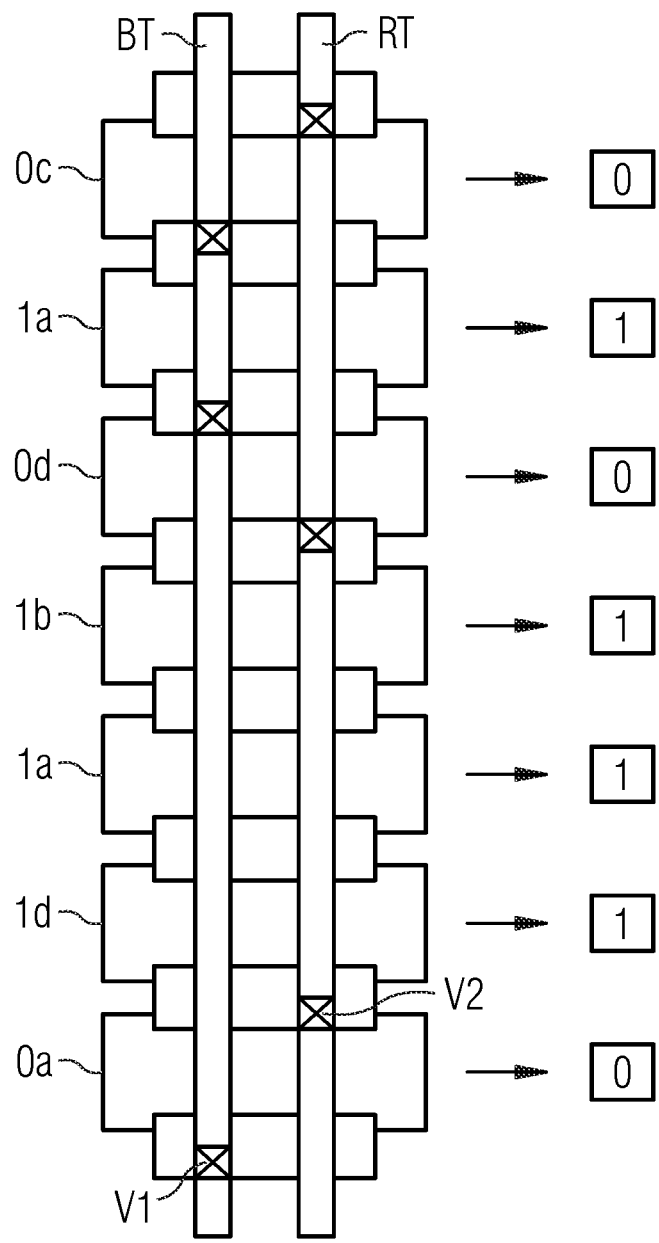

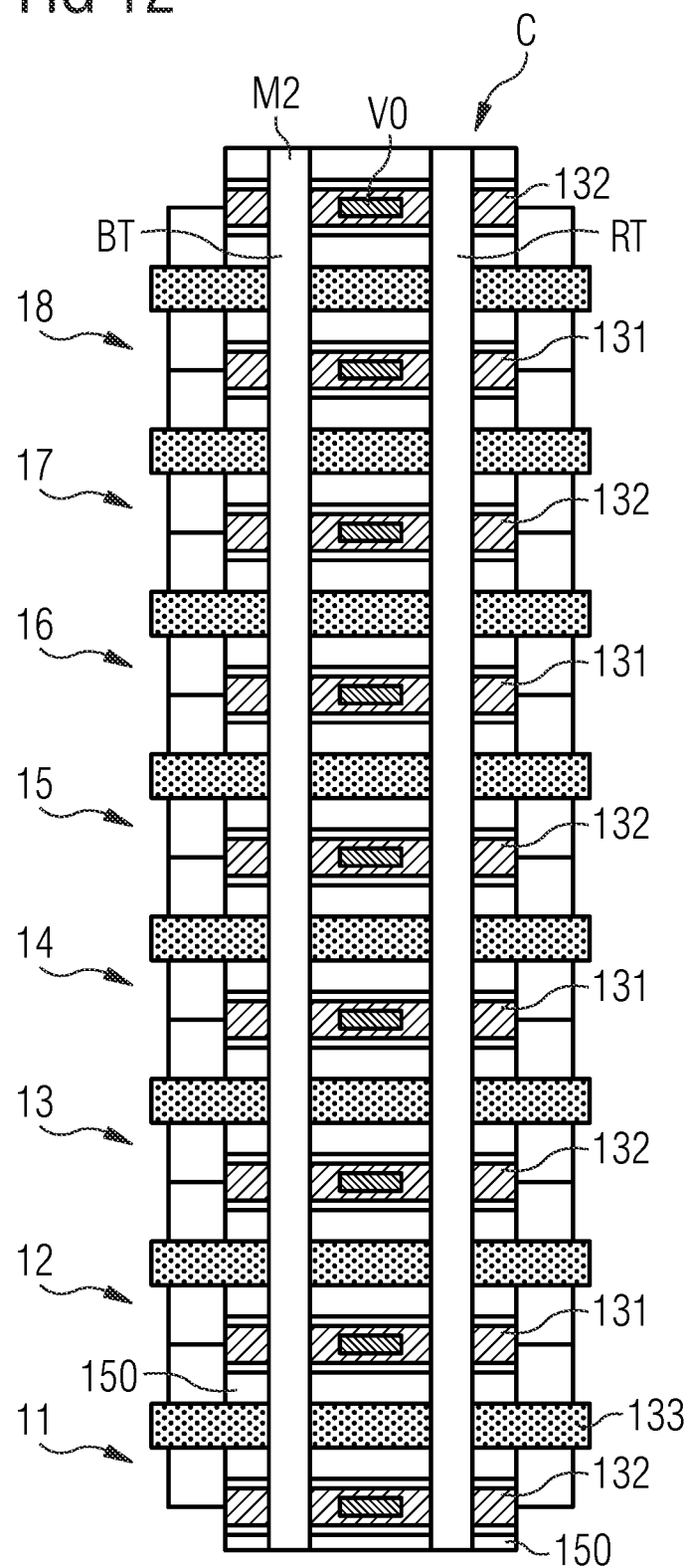

METHOD TO PROGRAM BITCELLS OF A ROM ARRAY

CROSS REFERENCE TO RELATED APPLICATIONS

This application claims the right of priority under 35 U.S.C. § 119(a) to European Application Serial No. 15178040.0, filed Jul. 23, 2015, which is incorporated by reference in its entirety.

TECHNICAL FIELD

The disclosure relates to a method to program bitcells of a read only memory (ROM) array.

BACKGROUND

A ROM array is a non-volatile type memory. Any data stored in bitcells of the ROM array are not lost on power down of the memory array and can be retrieved after power up. The bitcells of the ROM array may be programmed by mask programming. In a mask programmed ROM array, the data is physically encoded in the circuit and data is programmed during fabrication only. Thus, it is impossible to change the respective content of the bitcells after fabrication of the ROM array. This leads to a number of serious disadvantages.

Apart from the fact that it is only economical to buy a storage device comprising a mask programmed ROM array in large quantities, one major technical disadvantage is that the turnaround time between completing the design for a mask programmed ROM array and receiving the finished product is long. Furthermore, a storage device comprising a mask programmed ROM array is usually impractical for research and development work since designers frequently need to modify the contents of the bitcells of the ROM array as they refine a design. Another disadvantage is that if a storage device is shipped with a faulty ROM array, the only way to fix it is to recall the product and physically replace the ROM array in every unit shipped.

In spite of the above constraints, a storage device comprising a ROM array is still economical over other ROM technology such as for example designs based on PROM, EPROM or EEPROM technology, as cost per chip is still less.

In the future the semiconductor memory technology will change more and more to smaller structures, for example from 28 nm technology to 16 nm technology.

SUMMARY

The disclosed configuration includes a system and method to program a read-only memory (ROM) array to help with scalability of the ROM array from one technology to another technology without any area penalty while satisfying requirements relating to the design rules.

An example embodiment of a method to program a ROM array comprises providing a bitline track and a referential track to supply a reference voltage to the ROM array, and providing the ROM array with a plurality of the bitcells being arranged in rows and columns, wherein each of the bitcells comprises a transistor having a drain region and a source region, a first conductive area and a second conductive area. The first conductive area is electrically connected to the drain region of the transistor and the second conductive area is electrically connected to the source region of the transistor. Each of the bitcells is configured to be programmed with one of a first and second item, wherein the ROM array comprises a first one of the plurality of bitcells being arranged in one of the columns and a first one of the rows of the ROM array, and a second one of the plurality of bitcells being arranged in said one of the columns and a second one of the rows being different from the first row.

The first bitcell may be programmed such that the first item may be programmed into the first bitcell by electrically connecting the bitline track to one of the first and second conductive area of the first bitcell by means of a first conductive via of the first bitcell and by electrically connecting the referential track to the other one of the first and second conductive area of the first bitcell by means of a second conductive via of the first bitcell. The first conductive via of the first bitcell may be connected to one of a plurality of zones of said one of the first and second conductive area of the first bitcell. The second conductive via of the first bitcell is connected to one of the plurality of zones of said other one of the first and second conductive area of the first bitcell. Alternately, the first bitcell may be programmed such that the second item is programmed into the first bitcell by electrically isolating the bitline track from said one of the first and second conductive area of the first bitcell and by electrically isolating the referential track from said other one of the first and second conductive area of the first bitcell.

The second bitcell may be programmed such that the first item is programmed into the second bitcell by electrically connecting the bitline track to one of the first and second conductive area of the second bitcell by means of a first conductive via of the second bitcell, The first conductive via of the second bitcell is connected to one of a plurality of zones of said one of the first and second conductive area of the second bitcell, and by electrically connecting the referential track to the other one of the first and second conductive area of the second bitcell by means of a second conductive via of the second bitcell, wherein The second conductive via of the second bitcell is connected to one of a plurality of zones of said other one of the first and second conductive area of the second bitcell. The respective one of the zones of the first and second conductive area is selected in dependence on the programmed item of the first bitcell. Alternatively, the second item is programmed into the second bitcell by electrically isolating the bitline track from said one of the first and second conductive area of the second bitcell and by electrically isolating the referential track from said other one of the first and second conductive area of the second bitcell.

Banking architecture is usually applied in memory to improve the power and performance targets. In memory banking architecture, a single monolithic array is partitioned into multiple sub arrays. A memory can have any number of banks (sub arrays) depending on the design. Orientation of these sub arrays is also varying from design to design. One design can have all sub array arranged in same orientation. Other design can have some banks arranged in R0 orientation (non-flipped) and the other banks arranged in MY orientation (flipped).

An example embodiment includes a method to program the bitcells of the ROM array. The first bitcell may be programmed in dependence on operating the ROM array as a flipped or non-flipped array. The second and all other subsequent bitcells located in the same column of the memory array as the first bitcell are programmed in dependence on operating the ROM array as a flipped or non-flipped array and additionally in dependence on the programming state/the programmed item of all its previously programmed bitcells located in the same column of the memory array. The programming algorithm works with all kind of memory design keeping orientation in mind.

Also in an example embodiment is a method to program the bitcells of the ROM array. For example, four different programming cells are used for storing one of the data items in the bitcells depending on operating the memory array as a flipped or non-flipped array. For instance, eight different programming cells are required to do programming over ROM array in the proposed algorithm. According to a possible embodiment of the method to program the bitcells of the ROM array, across the first (bottom) row in each bank of the memory array only one programming cell would be used for programming the first item, for example the data "0", and only one other programming cell would be used to program the second item, for example the data "1", into one of the bitcells, wherein the configuration of the programming cell for programming the first item changes in dependence on operating the memory array as a flipped or non-flipped array, whereas the internal structure of the programming cell for programming the second item may be kept unchanged and thus is independent from operating the memory array as flipped or non-flipped array.

BRIEF DESCRIPTION OF THE DRAWINGS

FIG. 2 shows a ROM array comprising bitcells arranged in rows and columns.

FIG. 6A shows different embodiments of programming cells to program a bitcell with the first item.

FIG. 6B shows different embodiments of bitcells programmed with the first item.

FIG. 9A shows an embodiment of a method/algorithm to program bitcells along a column of a non-flipped ROM array.

FIG. 9B shows an embodiment of a method/algorithm to program bitcells of a flipped ROM array.

FIG. 10 shows the programming of bitcells of a non-flipped and a flipped ROM array.

FIG. 11B shows the programming of bitcells along a column of a ROM array.

FIG. 12 shows an arrangement of ROM bitcells along a column of a memory array without programming cells.

DETAILED DESCRIPTION

The disclosed configurations will now be described in more detail hereinafter with reference to the accompanying drawings showing preferred embodiments of the invention. The invention may, however, be embodied in many different forms and should not be construed as limited to the embodiments set forth herein; rather, these embodiments are provided so that the disclosure will fully convey the scope of the invention to those skilled in the art.

Figure 1A:
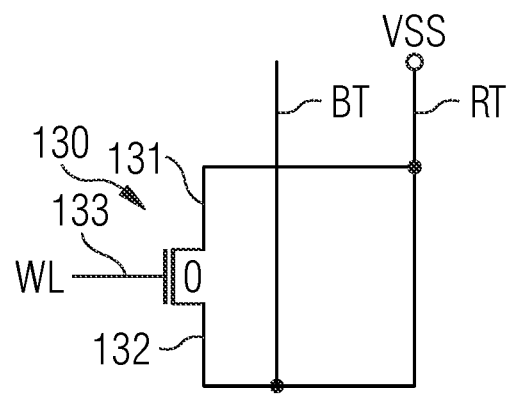
FIG. 1A shows the programming of a bitcell of a ROM array for storing a first data item.

Figure (FIG. 1A shows a ROM bitcell which is programmed for storing a first item, for example a data "0". The bitcell comprises a transistor 130 comprising a drain region 131, a source region 132 and a gate 133 to which a wordline track WL is connected. In order to program the first item, for example the data "0", into the bitcell, the drain region 131 may be connected to a referential track RT to apply a reference voltage VSS. The source region 132 may be connected to a bitline track BT. The connection of the drain and source regions 131 and 132 to the bitline track BT and the referential track RT are interchangeable so that it is also possible to connect the source region 132 to the referential track RT and to connect the drain region 131 to the bitline track BT to store the first item, for example the data "0", into the bitcell.

Figure 1B:
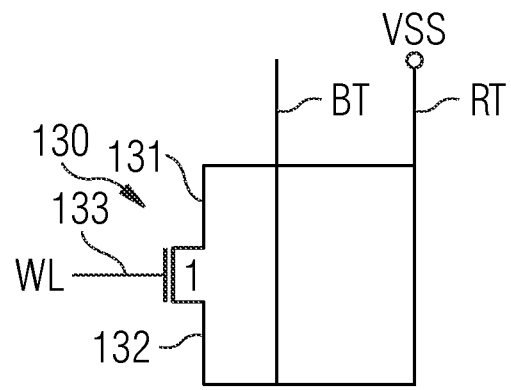
FIG. 1B shows the programming of a bitcell of a ROM array for programming a second data item.

FIG. 1B shows the programming of the ROM bitcell with a second item, for example a data "1". According to a first possibility to store the second data item in the bitcell, the drain region 131 and the source region 132 are in a floating state, as shown in FIG. 1B. The bitline track BT and the referential track RT are not connected to any of the drain and source regions 131 and 132. A second possibility for storing the second item in the bitcell is to connect the source region 132 to the bitline track BT and to operate the drain region 131 in a floating state and vice versa. According to a third possibility for storing the second item in the bitcell, the source region 132 is connected to the referential track RT and the drain region 131 is operated in a floating state and vice versa. According to a fourth possibility for storing the second item in the bitcell, both of the drain and source regions 131, 132 are connected to one of the bitline track BT or the referential track RT.

FIG. 2 shows an embodiment of a ROM array 10 comprising a plurality of bitcells 11, 12, 13, . . . , mn being arranged within the ROM array in rows R1, . . . , Rn and columns C1, . . . , Cn. A bitline track BT and a referential track RT to a supply the reference voltage VSS are running along the columns C1, . . . , Cm. Wordlines WL are running along the rows R1, . . . Rn.

Figure 3:
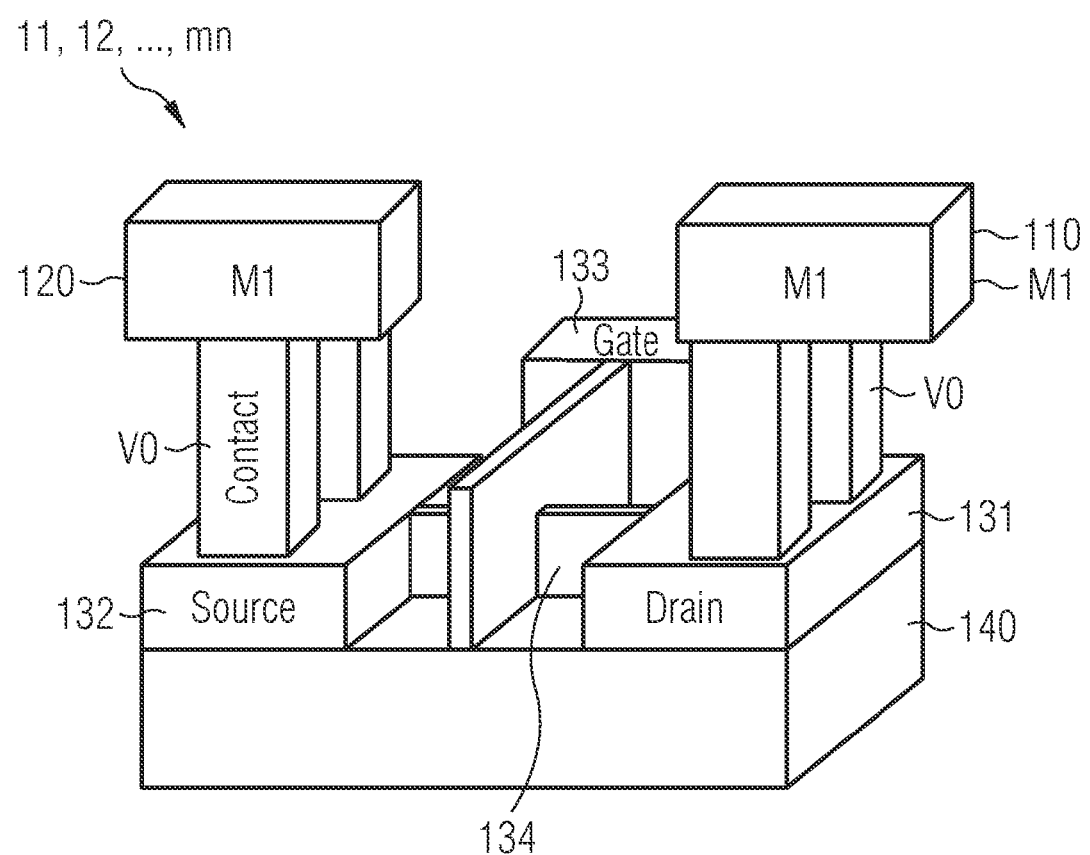
FIG. 3 shows a perspective view of a bitcell using FinFET technology.

FIG. 3 shows an embodiment of one of the bitcells 11, 12, 13 . . . , mn of FIG. 2 in a perspective view. The bitcell is configured as a ROM bitcell designed in FinFET technology. The bitcell comprises a FinFET transistor 130 being disposed with its drain region 131 and its source region 132 as well as its gate region 133 on a substrate 140. The transistor comprises fins 134 forming the conductive channel between the source and drain regions. The bitcell comprises conductive areas 110 and 120 which are arranged above the FEOL layers of the transistor 130 in a metal layer M1. The conductive area 110 is arranged above the drain region 131 and is connected to the drain region 131 by means of conductive vias V0. The conductive area 120 which is arranged above the source region 132 is electrically connected to the source region 132 by the conductive via V0.

Figure 4A:
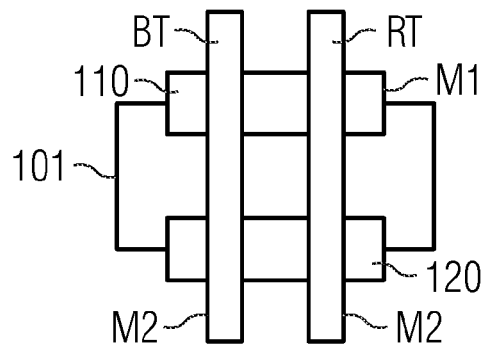
FIG. 4A shows an embodiment of layers of a bitcell.

FIG. 4A shows a top view on one of the unprogrammed bitcells being still in an unprogrammed state. The FEOL layers of the bitcell are not shown in FIG. 4A. The bitcell is surrounded by a borderline 101. The conductive area 110 and the conductive area 120 of BEOL layer M1 shown in FIG. 3 are arranged above the drain and source regions of the transistor. The bitline track BT and the referential track RT are running in a BEOL layer M2 above the conductive areas 110 and 120.

Figure 4B:
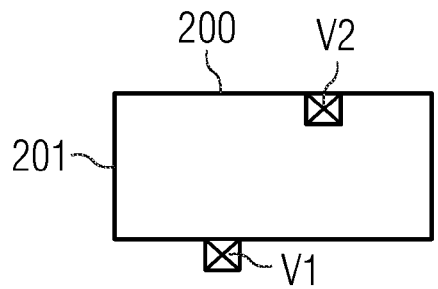
FIG. 4B shows an embodiment of layers of a programming cell.

FIG. 4B shows a programming cell 200 having a borderline 201. The programming cell comprises a conductive via V1 to be connected to the bitline track BT and a conductive via V2 to be connected to the referential track RT. The programming cell 200 shown in FIG. 4B may be used to program the first item, for example the data "0" into the bitcell. In order to program the bitcell with the data "0", the programming cell 200 is arranged between the metal layers M1 and M2. The conductive via V1 electrically connects one of the conductive areas 110, 120 to the bitline track BT. The conductive via V2 connects one of the conductive areas 110, 120 to the referential track RT.

Figure 4C:
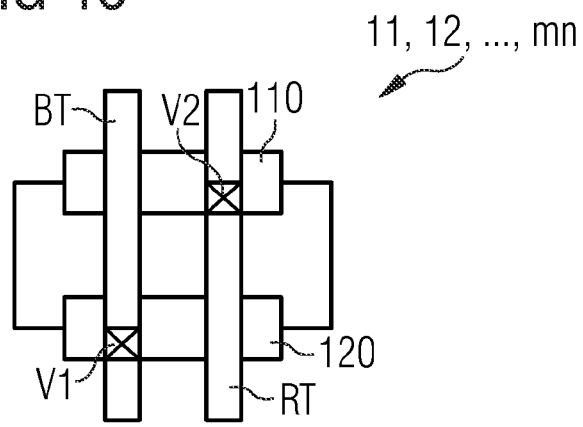
FIG. 4C shows an embodiment of layers of a bitcell programmed with the first item.

FIG. 4C shows one of the bitcells 11, 12, ..., mn of the memory array 10 being programmed by the first item, for example the data "0". The programming cell 200 is provided between the metal layers M1 and M2. As shown in FIG. 4C, the bitline track BT is electrically connected to the conductive area 120 by means of the conductive via V1. The referential track RT is electrically connected to the conductive area 110 by the conductive via V2. According to the present invention, the placement of the conductive vias V1, V2, i.e. the design of the programming cell 200 is selected from a plurality of possibilities as described below in more detail with reference to FIGS. 6A and 6B.

Figure 5:
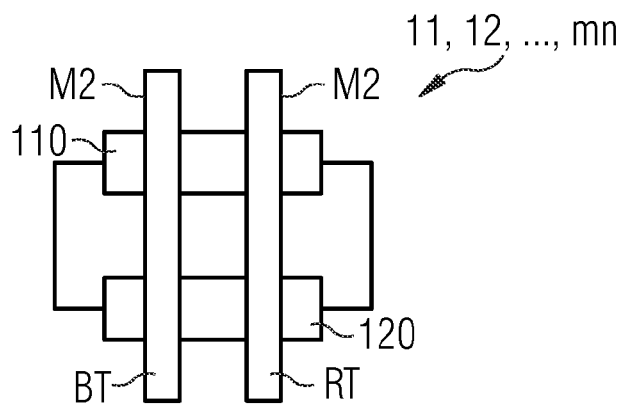
FIG. 5 shows an embodiment of layers of a bitcell programmed with a second item.

FIG. 5 shows a top view of one of the bitcells 11, ..., mn of the ROM array of FIG. 2 being programmed with the second item, for example the data "1". The bitcell comprises the conductive areas 110 and 120 of BEOL layer M1. The FEOL layers of the transistor 130 are not shown. The bitcell is surrounded by the borderline 101. The bitline track BT and the referential track RT run in BEOL metal layer M2. For storing the second item into the bitcell, a programming cell is provided that does not comprise any conductive vias V1 and V2. The programming cell is provided between the metal layers M1 and M2. Since the programming cell for programming the second item does not comprise any of the conductive vias, the conductive area 110 and the conductive area 120 are not connected to any one of the bitline track BT and the referential track RT. Thus, the drain and source regions of the transistor arranged below the conductive areas 110 and 120 are in a floating state, as explained in FIG. 1B.

FIG. 6A shows a plurality of programming cells 0a, ..., 0h used to program the bitcells with the first item, for example the data "0". Each of the programming cells comprises the conductive via V1 and the conductive via V2. The conductive vias V1 and V2 of the different programming cells are arranged at different locations. In the programmed state of a bitcell, the programming cell is arranged between the conductive areas 110, 120 and the bitline track BT and the referential track RT. In the programmed state of a bitcell, the conductive via V1 is electrically connected to the bitline track BT and connected to one of the conductive areas 110, 120 of the bitcell, and the conductive via V2 is electrically connected to the referential track RT and connected to the other one of the conductive areas 110, 120 of the bitcell.

FIG. 6B shows programmed bitcells 100a, ..., 100h being programmed with the first item, for example the data "0". Due to the different locations of the conductive vias in the programming cells 0a, ..., 0h, the conductive vias V1 and V2 of the different programming cells are placed to different zones z11, ..., z24 of the conductive area 110 and 120 of the bitcells. The bitline track BT and the referential track RT are not shown in FIG. 6B and are arranged as shown, for example in FIG. 4C.

The programming cell 0a comprises the conductive via V1 being arranged in relation to the border line 201 on the lower left side of the programming cell. The conductive via V2 is placed on the upper right side of the programming cell in relation to the border line 201. The bitcell 100a is programmed with the first item by means of the programming cell 0a. After having arranged the programming cell 0a between the layers M1 and M2, the conductive via V1 which is electrically connected to the bitline track BT is placed on a zone z21 of the conductive area 120. The conductive via V2 which is electrically connected to the referential track RT is placed on a zone z11 of the conductive area 110.

The programmed bitcell 100b is programmed with the first item, for example the data "0", by means of the programming cell 0b. The bitcell 100b comprises the conductive via V1 electrically connected to the bitline track BT which is connected to the conductive area 110 of the bitcell 100b at a zone z12 of the conductive area 110. The conductive via V2 electrically connected to the referential track RT is connected to the conductive area 120 of the bitcell 100b at a zone z22 of the conductive area 120.

The programmed bitcell 100c is programmed with the first item, for example the data "0", by means of the programming cell 0c. The conductive via V1 of the programming cell 0c which electrically connects the bitline track BT with the conductive area 120 of the bitcell 100c is placed at a zone z23 of the conductive area 120. The conductive via V2 which is connected to the referential track RT and the conductive area 110 of the bitcell 100c is placed at the zone z11 of the conductive area 110 of the bitcell 100c.

The programmed bitcell 100d is programmed with the first item, for example the data "0", by means of the programming cell 0d. The conductive via V1 electrically connected to the bitline track BT is placed at the zone z12 of the conductive area 110 of the bitcell 100d. The conductive via V2 of the programming cell 0d which is electrically connected to the referential track RT is placed at a zone z24 of the conductive area 120 of the bitcell 100d.

The programmed bitcell 100e in which the first item, for example the data "0", is stored has been programmed by means of the programming cell 0e comprising the conductive vias V1 and V2 located as shown in FIG. 6A. The conductive via V1 electrically connected to the bitline track BT is placed at a zone z13 of the conductive area 110 of the bitcell 100e. The conductive via V2 which electrically connects the referential track RT to the conductive area 120 of the bitcell 100e, is placed at a zone z24 of the conductive area 120.

The programmed bitcell 100f in which the first item, for example the data "0", is stored, is programmed by means of the programming cell 0f. The conductive via V1 of the programming cell 0f which is electrically connected to the bitline track BT is placed at the zone z23 of the conductive area 120. The conductive via V2 of the programming cell 0f which is electrically connected to the referential track RT is placed at a zone z14 of the conductive area 110 of the bitcell 100f.

The programmed bitcell 100g in which the first item, for example the data "0", is stored, is programmed by means of the programming cell 0g comprising the conductive vias V1 and V2 located as shown in FIG. 6A. The conductive via V1 which is electrically connected to the bitline track BT and the conductive area 110 of the bitcell 100g is placed at the zone z12 of the conductive area 110. The conductive via V2 which electrically connects the referential track RT with the conductive area 120 of the bitcell 100g is placed at the zone z23 of the conductive area 120.

The programmed bitcell 100h in which the first item, for example the data "0", is stored, is programmed by means of the programming cell 0h comprising the conductive vias V1 and V2 located as shown in FIG. 6A. The conductive via V1 which electrically connects the bitline track BT with the conductive area 120 of the bitcell 100h is placed at the zone z23 of the conductive area 120. The conductive via V2 which electrically connects the referential track RT with the conductive area 110 of the bitcell 100h is placed at the zone z11 of the conductive area 110.

Figure 7A:
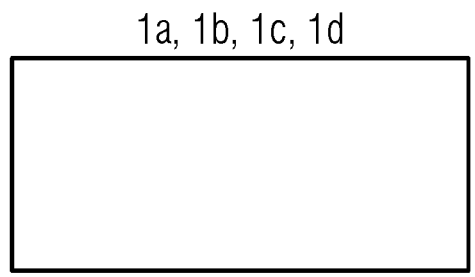
FIG. 7A shows an embodiment of a programming cell to program a bitcell with the second item.
Figure 7B:
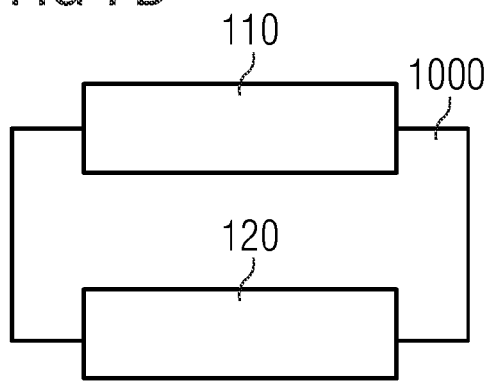
FIG. 7B shows an embodiment of a bitcell programmed with the second item.

FIG. 7A shows a respective embodiment of programming cells 1a, 1b, 1c, 1d which is used to program the bitcells with a second item, for example the data "1". The embodiment of the programming cells 1a, 1b, 1c, 1d does not comprise any of the conductive vias V1 and V2. FIG. 7B shows a programmed bitcell 1000 being programmed with the first item by means of one of the programming cells 1a, 1b, 1c, 1d. The conductive areas 110 and 120 of the bitcell 1000 are electrically isolated from the bitline track BT and the referential track RT, because the programming cells 1a, 1b, 1c, 1d does not comprise the conductive vias V1 and V2. The bitline track BT and the referential track RT are not shown in FIG. 7B and are arranged as shown, for example in FIG. 5.

Figure 8:
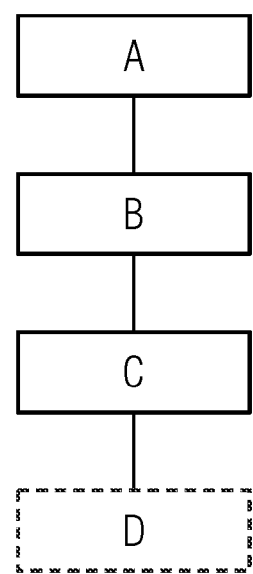
FIG. 8 shows steps of a method to program bitcells of a ROM array.

FIG. 8 shows steps A to D of a method to program bitcells of a ROM array of a storage device. According to step A, the bitline track BT and the referential track RT to supply the reference voltage VSS to the ROM array 10 are provided. The ROM array 10 is provided with a plurality of programmable bitcells 11, . . . , mn arranged in rows R1, . . . , Rn and columns C1, . . . , Cm. Each of the bitcells 11, . . . , mn comprises a transistor 130 having a drain region 131 and a source region 132, a first conductive area 110 and a second conductive area 120. The first conductive area 110 is electrically connected to the drain region 131 of the transistor, and the second conductive area 120 is electrically connected to the source region 132 of the transistor. Each of the bitcells 11, . . . , mn is configured to be programmed with one of a first and second item. The ROM array 10 comprises a first one of the plurality of bitcells 11 being arranged in one of the columns C1 and a first one of the rows R1 of the ROM array 10, and a second one of the plurality of bitcells 12 being arranged in said one of the columns C1 and a second one of the rows R2 being different from the first row R1.

According to step B of the method to program the bitcells of the ROM array, either the first item, for example the data "0", or the second item, for example the data "1", is programmed into the first bitcell 11. In order to program the first item, for example the data "0", into the first bitcell, the bitline track BT is electrically connected to one of the first and second conductive area 110, 120 of the first bitcell 11 by means of a first conductive via V1 of the first bitcell, and by electrically connecting the referential track RT to the other one of the first and second conductive area 110, 120 of the first bitcell 11 by means of a second conductive via V2 of the first bitcell 11. The first conductive via V1 of the first bitcell 11 is connected to one of a plurality of zones z11, . . . , Z24 of said one of the first and second conductive area 110 of the first bitcell 11. The second conductive via V2 of the first bitcell 11 is connected to one of the plurality of zones z11, . . . , z24 of said other one of the first and second conductive area 120 of the first bitcell 11.

In order to program the second item, for example the data "1", into the first bitcell 11, the bitline track BT is electrically isolated from said one of the first and second conductive area 110, 120 of the first bitcell 11, and the referential track RT is electrically isolated from said other one of the first and second conductive area 110, 120 of the first bitcell 11.

According to a method step C, the second bitcell 12 is programmed subsequently to the programming of the first bitcell 11 either with the first item, for example the data "0", or with the second item, for example the data "1". In order to store the first item into the second bitcell 12, the bitline track BT is electrically connected to one of the first and second conductive area 110, 120 of the second bitcell 12 by means of a first conductive via V1 of the second bitcell 12 and by electrically connecting the referential track RT to the other one of the first and second conductive area 110, 120 of the second bitcell 12 by means of a second conductive via V2 of the second bitcell 12. The first conductive via V1 is connected to one of a plurality of zones z11, . . . , z24 of said one of the first and second conductive area 110, 120 of the second bitcell 12. The second conductive via V2 of the second bitcell 12 is connected to one of a plurality of zones z11, z14 of said other one of the first and second conductive area 110, 120 of the second bitcell 12. The respective one of the zones z11, z14 of the first and second conductive area 110, 120 to which the first and second conductive via V1 and V2 of the second bitcell 12 is connected is selected in dependence on the previously programmed item of the first bitcell 11.

If the second bitcell 12 is to be programmed with the second item, for example the data "1", the bitline track BT is electrically isolated from said one of the first and second conductive area 110, 120 of the second bitcell 12, and the referential track RT is electrically isolated from said other one of the first and second conductive area 110, 120 of the second bitcell 12.

According to a possible embodiment of step B of the method to program the bitcells of the ROM array, when programming the first bitcell 11 with the first item, for example the data "0", the zone of said one of the first and second conductive area 110, 120 of the first bitcell 11 to which the first conductive via V1 of the first bitcell 11 is connected is selected from the plurality of the zones z11, . . . , z24 of said one of the first and second conductive area 110, 120 of the first bitcell 11 in dependence on operating the ROM array 10 as flipped ROM array in multibank instance or as non-flipped ROM array in multibank instance.

When programming the first bitcell 11 with the first item, the zone of said other one of the first and second conductive area 110, 120 of the first bitcell 11 to which the second conductive via V2 of the first bitcell 11 is connected is selected from the plurality of the zones z11, . . . , z24 of said other one of the first and second conductive area 110, 120 of the first bitcell 11 in dependence on operating the ROM array 10 as flipped ROM array in multibank instance or as non-flipped ROM array in multibank instance.

According to a possible embodiment of step B of the method to program the bitcells of the ROM array, when programming the first bitcell 11 with the first item, for example the data "0", one of a first zone z13 of the first conductive area 110 of the first bitcell 11 to which the first conductive via V1 of the first bitcell 11 is connected and one of a first zone z21 of the second conductive area 120 of the first bitcell 11 to which the first via V1 of the first bitcell 11 is connected is selected in dependence on operating the ROM array 10 as flipped ROM array in multibank instance or as non-flipped ROM array in multibank instance.

When programming the first bitcell 11 with the first item, one of a second zone z11 of the first conductive area 110 of the first bitcell 11 to which the second conductive via V2 of the first bitcell 11 is connected and a second zone z24 of the second conductive area 120 of the first bitcell 11 to which the second conductive via V2 of the first bitcell 11 is connected is selected in dependence on operating the ROM array 10 as flipped ROM array in multibank instance or as non-flipped ROM array in multibank instance.

According to a possible embodiment of step C of the method to program the bitcells of the ROM array, when programming the second bitcell 12 with the first item, for example the data "0", the zone of said one of the first and second conductive area 110, 120 of the second bitcell 12 to which the first via V1 of the second bitcell 12 is connected is selected from the plurality of the zones z11, . . . , z24 of said one of the first and second conductive area 110, 120 of the second bitcell 12 in dependence on the respective selected zone z11, . . . , z24 of the first and second conductive area 110, 120 of the first bitcell 11. Furthermore, when programming the second bitcell 12 with the first item, the zone of said other one of the first and second conductive area 110, 120 of the second bitcell 12 to which the second conductive via V2 of the second bitcell 12 is connected is selected from the plurality of the zones z11, . . . , z14 of said other one of the first and second conductive area 110, 120 of the second bitcell 12 in dependence on the respective selected zone z11, . . . , z24 of the first and second conductive area 110, 120 of the first bitcell 11.

According to another possible embodiment of step C of the method to program the bitcells of the ROM array, when programming the second bitcell 12 with the first item, for example the data "0", the zone of said one of the first and second conductive area 110, 120 of the second bitcell 12 to which the first conductive via V1 of the second bitcell 12 is connected is selected from the plurality of the zones z11, . . . , z14 of said one of the first and second conductive area 110, 120 of the second bitcell 12 in dependence on operating the ROM array 10 as flipped ROM array in multibank instance or as non-flipped ROM array in multibank instance. Furthermore, when programming the second bitcell 12 with the first item, the zone of said other one of the first and second conductive area 110, 120 of the second bitcell 12 to which the second conductive via V2 of the second bitcell 12 is connected is selected from the plurality of the zones z11, . . . , z24 of said other one of the first and second conductive area 110, 120 of the second bitcell 12 in dependence on operating the ROM array 10 as flipped ROM array in multibank instance or as non-flipped ROM array in multibank instance.

According to a possible embodiment of step C of the method to program the bitcells of the ROM array, when programming the second bitcell 12 with the first item, for example the data "0", a pair of the zones z11, . . . , z24 of the first and second conductive area 110, 120 of the second bitcell 12 to be connected to the first and second conductive via V1, V2 of the second bitcell 12 is selected from a total of possible four pairs of the zones, when the ROM array 10 is operated as flipped ROM array in multibank instance. When programming the second bitcell 12 with the first item, a pair of zones z11, . . . , z24 of the first and second conductive area 110, 120 of the second bitcell 12 to be connected to the first and second conductive via V1, V2 of the second bitcell 12 is selected from a total of four other pairs of the zones, when the ROM array 10 is operated as non-flipped ROM array in multibank instance.

According to a step D of the method to program the bitcells of the ROM array, the ROM array 10 is provided with a third one of the plurality of bitcells 13 being arranged in said one of the columns C1 and a third one of the rows R3 of the memory array 10 being arranged directly adjacent to the second one of the rows R2 of the memory array. The third bitcell 13 is either programmed with the first item, for example the data "0", or with the second item, for example the data "1".

In order to program the first item into the third bitcell 13, the bitline track BT is electrically connected to one of the first and second conductive area 110, 120 of the third bitcell 13 by means of a first conductive via V1 of the third bitcell 13, wherein the first conductive via V1 of the third bitcell 13 is connected one of a plurality of zones z11, . . . , z24 of said one of the first and second conductive area 110, 120 of the third bitcell 13. The referential track RT is electrically connected to the other one of the first and second conductive area 110, 120 of the third bitcell 13 by means of a second conductive via V2 of the third bitcell 13. The second conductive via V2 of the third bitcell 13 is connected to one of a plurality of zones z11, . . . , z24 of said other one of the first and second conductive area 110, 120 of the third bitcell 13.

The zone of said one of the first and second conductive area 110, 120 of the third bitcell 13 to which the first conductive via V1 of the third bitcell 13 is connected is selected from the plurality of the zones z11, . . . , z24 of said one of the first and second conductive area 110, 120 of the third bitcell 13 in dependence on the respective selected zone z11, z24 of the first conductive area 110 of the first and the second bitcell 11, 12 and the respective selected zone z11, . . . , z24 of the second conductive are 120 of the first and the second bitcell 11, 12.

If the third bitcell 13 is to be programmed with the second item, for example the data "1", the bitline track BT is electrically isolated from said one of the first and second conductive area 110, 120 of the third bitcell 13, and the referential track RT is electrically isolated from said other one of the first and second conductive area 110, 120 of the third bitcell 13.

According to the method to program the bitcells of the ROM array, when programming the ROM array 10, the first bitcell 11 is programmed before programming the second bitcell 12 and the second bitcell 12 is programmed directly subsequently to the first bitcell 11. Furthermore, the second bitcell 12 is programmed before programming the third bitcell 13 and the third bitcell 13 is programmed directly subsequently to the second bitcell 12.

According to a possible embodiment of step D of the method to program the bitcells of the ROM array, when programming the third bitcell 13 with the first item, for example the data "0", the zone of said one of the first and second conductive area 110, 120 of the third bitcell 13 to which the first conductive via V1 of the third bitcell 13 is connected is selected from the plurality of the zones z11, . . . , z14 of said one of the first and second conductive area 110, 120 of the third bitcell 13 in dependence on operating the ROM array 10 as flipped ROM array in multibank instance or as non-flipped ROM array in multibank instance. Furthermore, when programming the third bitcell 13 with the first item, the zone of said other one of the first and second conductive area 110, 120 of the third bitcell 13 to which the second conductive via V2 of the third bitcell 13 is connected is selected from the plurality of the zones z11, . . . , z24 of said other one of the first and second conductive area 110, 120 of the third bitcell 13 in dependence on operating the ROM array 10 as flipped ROM array in multibank instance or as non-flipped ROM array in multibank instance.

According to another possible embodiment of step D of the method to program the bitcells of the ROM array, when programming the third bitcell 13 with the first item, for example the data "0," a pair of the zones z11, ..., z24 of the first and second conductive area 110, 120 of the third bitcell 13 to be connected to the first and second conductive via V1, V2 of the third bitcell 13 is selected from the total of the four pairs of the zones, when the ROM array 10 is operated as flipped ROM array in multibank instance. In the case of operating the ROM array 10 as non-flipped ROM array in multibank instance, when programming the third bitcell 13 with the first item, a pair of the zones z11, ..., z24 of the first and second conductive area 110, 120 of the third bitcell 13 to be connected to the first and second conductive via V1, V2 of the third bitcell 13 is selected from the total of the four other pairs of the zones.

According to another possible embodiment of step C and D of the method to program the bitcells of the ROM array, when programming one of the second and third bitcell 12, 13 with the first item, for example the data "0", a first zone z12 of the first conductive area 110 or one of a first and a second zone z21, z23 of the second conductive area 120 of the respective second and third bitcell 12, 13 is respectively selected to be connected to the respective first conductive via V1 of the second and third bitcell 12, 13, when the ROM array 10 is operated as non-flipped ROM array in multibank instance. Furthermore, when programming the second and third bitcell 12, 13 with the first item, a second zone z11 of the first conductive area 110 or one of a third and fourth zone z22, z24 of the second conductive area 120 of the respective second and third bitcell 12, 13 is respectively selected to be connected to the respective second conductive via V2 of the second and third bitcell 12, 13, when the ROM array 10 is operated as non-flipped ROM array in multibank instance.

According to another possible embodiment of step C and D of the method to program the bitcells of the ROM array, when programming the second and third bitcell 12, 13 with the first item, one of a first and second zone z12, z13 of the first conductive area 110 or a first zone z23 of the second conductive area 120 of the respective second and third bitcell 12, 13 is selected to respectively be connected to the respective first conductive via V1 of the second and third bitcell 12, 13, when the ROM array 10 is operated as flipped ROM array in multibank instance. When programming the second and third bitcell 12, 13 with the first item, one of a third and fourth zone z11, z14 of the first conductive area 110 or a second zone z24 of the second conductive area 120 of the respective second and third bitcell 12, 13 is selected to be respectively connected to the respective second conductive via V2 of the second and third bitcell 12, 13, when the ROM array 10 is operated as flipped ROM array in multibank instance.

According to an example embodiment, the ROM array 10 is configured as a ROM designed in 16 nm FinFET technology. Each of the bitcells 11, 12, ..., mn comprises a transistor 130 being configured as a FinFET.

FIGS. 9A and 9B respectively show an embodiment of the method to program bitcells of a ROM array. FIG. 9A shows a programming algorithm to be used, if the ROM array 10 is configured as a non-flipped array in multibank instance. FIG. 9B shows a programming algorithm to be used, if the ROM array 10 is configured as a flipped array in multibank instance.

Both of the algorithms start the programming of the bitcells of the non-flipped/flipped memory array by primarily programming the first bitcell located in the first (bottom) row R1 and one of the columns, for example the column C1, of the ROM array. The programming cell 0a, ..., 0h and 1a, ..., 1d used to program the desired item in the first bitcell of a column depends on the desired data and the operation of the memory array as a flipped or non-flipped array. Starting with the first bitcell all other bitcells located in the same column as the first bitcell are programmed one after the other. The used programming cells 0a, ..., 0h, and 1a, ..., 1d to program the other bitcells of the same column depends on the operation of the memory array as flipped or non-flipped array and the programming cells used for programming the previously programmed bitcells of the same column.

The programming algorithm of FIG. 9A use the programming cells 0a to 0d shown in FIG. 6A for programming the first item, for example the data "0", into the bitcells, and the programming cells 1a, ..., 1d shown in FIG. 7A for programming the second item, for example the data "1", into the bitcells. The internal structures of the programming cells 1a, 1b, 1c and 1d do not differ among each other.

Referring to FIG. 2, the first bitcell in the first row R1 and the first column C1 is the bitcell 11. If the first item, for example the data "0", is to be stored in the first (bottom) bitcell 11, the algorithm in FIG. 9A shows that for programming the bitcell 11 with the data "0" the programming cell 0a has to be used so that after programming with the programming cell 0a, the bitcell 11 is programmed as shown for the programmed bitcell 100a in FIG. 6B. On the other hand, if the first (bottom) bitcell 11 is to be programmed with the second item, for example the data "1", the bitcell 11 is programmed by means of the programming cell 1b so that the programmed bitcell 11 is embodied as shown for the programmed bitcell 1000 in FIG. 7B.

Assuming that the first bitcell 11 is programmed by means of the programming cell 0a with the first item, for example the data "0", and a second bitcell 12 arranged in the same column C1 directly adjacent to the bitcell 11, i.e. in the column C1 and the row R2, has to be programmed by the first item, for example the data "0", according to the algorithm of FIG. 9A, the bitcell 12 has to be programmed by means of the programming cell 0b shown in FIG. 6A. If the bitcell 12 is to be programmed by the second item, for example the data "1", according to the algorithm of FIG. 9A, the bitcell 12 is to be programmed by means of the programming cell 1d and embodied as shown for the bitcell 1000 in FIG. 7B.

In the same way, all other bitcells following the bitcell 12 are programmed according to the scheme shown in FIG. 9A, if the ROM array is configured as a non-flipped array.

FIG. 9B shows the algorithm to program bitcells arranged in a ROM array configured as a flipped array in multibank instance. In this case, the programming cells 0e, 0f, 0g and 0h are used to program the bitcells by the first item, for example the data "0". For programming the bitcells with the second item, for example the data "1", the programming cells 1a, ..., 1d are used.

FIG. 10 shows an embodiment of a ROM array 10 comprising an upper bank 10a being configured as a flipped array in multibank instance and a lower bank 10b being configured as a non-flipped array in multibank instance. The bitcells of each column are programmed row by row starting from the first row R1 to the next row R2 being directly subsequently arranged to the first row R1 until to the last row Rn.

When programming the flipped array 10a, the bitcell 11a located in the first row R1 of the first column C1 is programmed first. If the bitcells 11, 21, 31, ..., m1 located in the first row of the flipped bank are to be programmed with the first item (item "0"), then only the programming cell 0e is used. If the bitcells 11, 21, 31, . . . , m1 arranged in the first row of the flipped bank are to be programmed with the second item (item "1"), then only the programming cell 1b is used.

If the first item, for example the data "0", is to be stored in the bitcell 11a, the bitcell 11a is programmed by means of the programming cell 0e, as taught by the algorithm shown in FIG. 9B. If the subsequent bitcell 12a located in the same column C1 and the subsequent row R2 is to be programmed by the first item, for example the data "0", the bitcell 12a is to be programmed by means of the programming cell 0f, as taught by the programming scheme of FIG. 9B. The next bitcell to be programmed is the bitcell 13a located in the same column C1 and the subsequent row R3. If the bitcell 13a has to be programmed with the second item, for example the data "1", the algorithm of FIG. 9B teaches to use the programming cell 1c. All other bitcells are programmed in the same way by means of the programming scheme of FIG. 9B.

The bitcells of the non-flipped row array 10b are programmed starting with the bitcell 11b in the first column C1 and the first row R1 of the lower bank 10b according to the algorithm shown in FIG. 9A. All other bitcells 12b, 13b located in the same column C1 are programmed one after the other according to the algorithm of FIG. 9A by means of the programming cells 0a, 0d for programming the first item and by means of the programming cells 1a, . . . , 1d for programming the second item. If the bitcells 11, 21, 31, . . . , m1 arranged in the first row of the non-flipped bank are to be programmed to the first item (item "0"), then only the programming cell 0a is used. If the bitcells 11, 21, 31, . . . , m1 arranged in the first row of the non-flipped bank are to be programmed with the second item (item "1") then only the programming cell 1b is used.

Figure 11A:
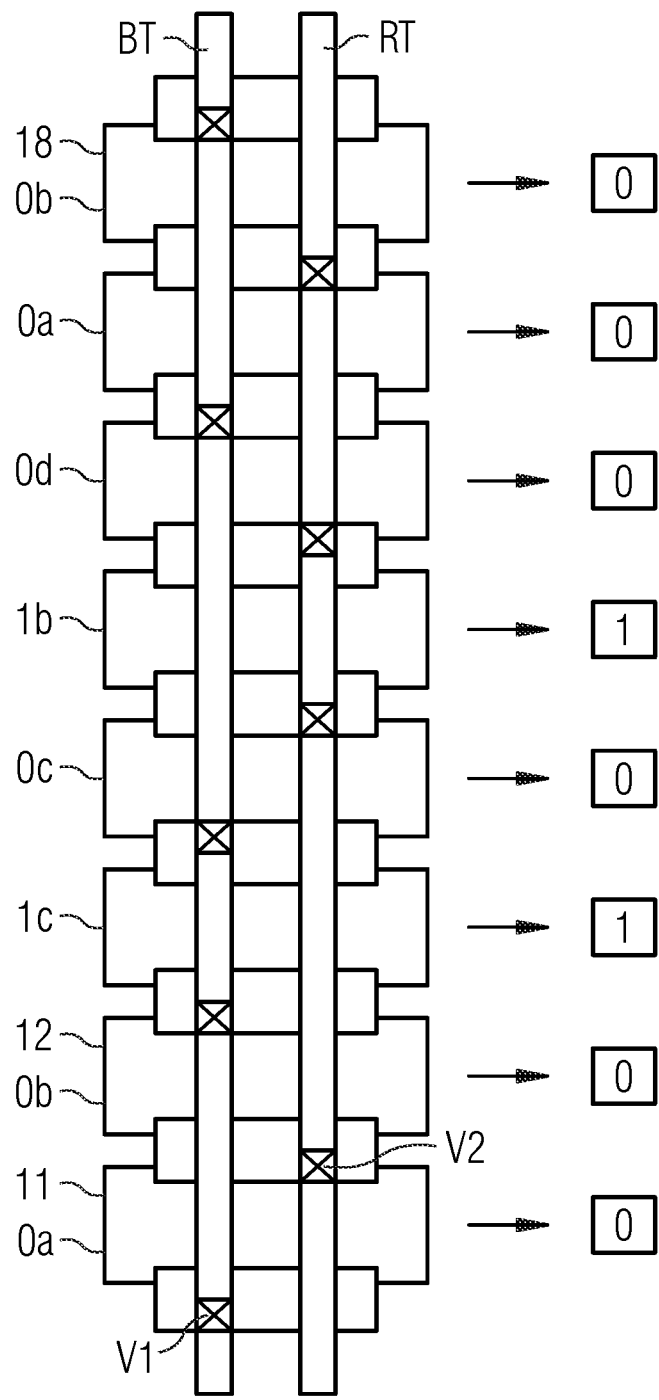
FIG. 11A shows the programming of bitcells along a column of a ROM array.

FIG. 11A shows programmed bitcells 11, 12, . . . , 18 being arranged in a ROM array being configured as a non-flipped array along the same column. The bitcells are programmed using programming cells according to the programming scheme shown in FIG. 9A. Bitcell 11 is programmed with item "0" by means of programming cell 0a, bitcell 12 is programmed with item "0" by means of programming cell 0b etc. As illustrated in FIG. 11A, the method to program the bitcells allows to meet the metal via spacing rules for the metallized vias V1 and V2.

FIG. 11B shows an arrangement of ROM bitcells 11, 12, . . . , 17 along a column C of a non-flipped ROM array. The bitcell 11, 12, . . . , 17 are successively programmed with the items "0", "1", "1", "1", "0", "1" and "0" according to the programming scheme shown in FIG. 9A by using the programming cells 0a, 1d, 1a, 1b, 0d, 1a and 0c. The bitcells 112, 13, 14 and 16 are programmed with item "1" by using the programming cells 1d, 1a, 1b and 1a having the same structure, i.e. they do not comprise any of the conductive vias V1 and V2. However, after the programming of the bitcells is finished, the programmed bitcells in which item "1" is stored may have the conductive vias V1 and V2, because adjacent cells along row or column are programmed with first item or the second item.

The programming of the second item (data item "1") into a bitcell is achieved by ensuring no direct path between source and drain region. If a direct path exists due to programming of above and below bitcell to first item, it is necessary to ensure that both of the source and drain region are connected to the same potential either connected to the bitline track BT or the referential track RT through programming algorithm. It can be achieved by the following scenario depending on programming of above and below bitcells to first item or second item. If both bitcells above and below a bitcell to be programmed with the second item are respectively programmed with the second item, both first and second conductive areas 110, 120 of the bitcell to be programmed with the second item are not connected to either of bitline track or referential track so that both conductive areas 110 and 120 of the bitcell to be programmed are isolated. If both bitcells above and below a bitcell to be programmed with the second item are respectively programmed with the first item, both first and second conductive areas 110, 120 of the bitcell to be programmed with the second item are connected to either bitline track and referential track. In the case, if one of the bitcell above or below the bitcell to be programmed with the second item is programmed to the first item and the other one of the bitcells above or below the bitcell to be programmed with the second item is programmed to the second item, the conductive area 110 of the bitcell to be programmed with the second item is connected to either bitline track or referential track and the other conductive area 120 of the bitcell to be programmed with the second item is isolated. If one of the bitcell above or below the bitcell to be programmed with the second item is programmed to the first item and the other one of the bitcells above or below the bitcell to be programmed with the second item is programmed to the second item, the conductive area 110 of the bitcell to be programmed with the second item is connected to either bitline track or referential track and the other conductive area 120 of the bitcell to be programmed with the second item is isolated.

FIG. 12 shows an arrangement of ROM bitcells 11, 12, . . . , 18 along a column C of a memory array without the programming cells. The via V0 connection is shown used for connecting the metal layer M1 to the drain or source end. Each of the bitcells 11, 12, . . . , 18 comprises a diffusion zone 150, a drain region/terminal 131, a source region/terminal 132 and gate region 133. The bitline track BT and the referential track RT to supply the reference voltage VSS runs along the column in the metal layer M2. As shown in FIG. 12, drain and source terminals 131, 132 are interleaved across adjacent bitcells. A high density mask ROM is achieved by sharing the diffusion region 150 across the bitcells 11, 12, . . . , 18 arranged in the same column C.

The method to program the bitcells of the ROM array uses twelve programming cells 0a, . . . , 0h and 1a, . . . , 1d to overcome the limiting criteria for metal via spacing rule and allows to achieve the desired scaling of ROM bitcells for 16 FFP technology over 28 nm technology. The proposed algorithm for programming the bitcells in the ROM array allows to satisfy the metal via spacing rule in a smaller area and to achieve 38% area scaling with reference to a ROM array in the 28 nm technology. In the 16 nm technology, dimension of a ROM bitcell programmed by using the proposed algorithm has a length of 0.240 μm and a width of 0.090 μm and thus only an area of 0.02160 μm2. It also helps improving performance as run length of bitline per bitcell is reduced to half and driving current per bitcell is also increased as using three fins device.

The method to program the bitcells provides a ROM structure that comprises bitcells arranged in rows and columns of a ROM array, each bitcell comprising one transistor. The transistors of the bitcells in one of the columns share source regions and drain regions of the bitcells alternatively. Each column has a bitline track and a referential track on a metal layer running above all source regions and drain regions, and conductive vias connecting bitline track and referential track to selected source regions and drain regions.

Each of the bitcells programmed as having a first logic value has two possible configurations: according to a first possible configuration, the source region of the respective bitcell is connected to the bitline track and the drain region of the respective bitcell is connected to the referential track, and, according to a second possible configuration, the source region of the respective bitcell is connected to the referential track and the drain region of the respective bitcell is connected to the bitline track.

Each of the bitcells programmed as having a second logic value has four possible configurations: according to a first possible configuration, the source region of the respective bitcell is connected to the bitline track or the referential track and the drain region of the respective bitcell floating; according to a second possible configuration, the source region of the respective bitcell is floating and the drain region of the respective bitcell is connected to the bitline track or the referential track; according to a third possible configuration both of the source region and the drain of the respective bitcell region are floating; and, according to a fourth possible configuration, both of the source region and the drain region of the respective bitcell is connected to the bitline track or the referential track.

The method to program the bitcells of the ROM array may be automatically carried out by means of a programming device, for example a ROM compiler, being configured to program the bitcells of the ROM array. The programming device/ROM compiler receives ROM contents and program code (or software comprised of computer instructions) to generate a ROM structure, as described above, for the received ROM contents. The programming device/ROM compiler may be controlled by a processor (one or more processors) of a computer. The processor may execute the program code. The program code may be stored in a non-transitory computer readable storage medium (e.g., a disk, memory) of the computer. A computer program product comprised of the program code may be adapted to be loaded from the non-transitory computer readable storage medium of the computer. The computer program product comprises portions of the program code corresponding to the methods described to program bitcells of a ROM array as described above. The computer program product may be executed by the processor to perform the corresponding methods.

What is claimed is:

1. A read only memory (ROM) structure, comprising:
   bitcells arranged in rows and columns of a ROM array, each bitcell comprising one transistor,
   the transistors of the bitcells in one of the columns sharing source regions and drain regions of the bitcells alternatively,
   each column having a bitline track and a referential track on a metal layer running above all source regions and drain regions, and
   conductive vias connecting bitline track and referential track to selected source regions and drain regions,
      wherein each of the bitcells programmed as having a first logic value has two possible configurations: the source region of the respective bitcell connected to the bitline track and the drain region of the respective bitcell connected to the referential track, and the source region of the respective bitcell connected to the referential track and the drain region of the respective bitcell connected to the bitline track,
      wherein each of the bitcells programmed as having a second logic value has four possible configurations: the source region of the respective bitcell connected to the bitline track or the referential track and the drain region of the respective bitcell floating, the source region of the respective bitcell floating and the drain region of the respective bitcell connected to the bitline track or the referential track, both of the source region and the drain of the respective bitcell region floating, and both of the source region and the drain region of the respective bitcell connected to the bitline track or the referential track,
   wherein each of the bitcells comprises a first conductive area, and a second conductive area, wherein the first conductive area is electrically connected to the drain region of the transistor of the respective bitcell and the second conductive area is electrically connected to the source region of the transistor of the respective bitcell, wherein each of the bitcells is configured to be programmed with one of the first and the second logic value, wherein the ROM array comprises a first one of the bitcells being arranged in one of the columns and a first one of the rows of the ROM array being arranged in said one of the columns and a second one of the rows being different from the first row,
   wherein either the first logic value is programmed into the first bitcell by electrically connecting the bitline track to one of the first and second conductive area of the first bitcell by means of a first one of the conductive vias of the first bitcell, wherein the first conductive via of the first bitcell is connected to one of a plurality of zones of said one of the first and second conductive area of the first bitcell, and by electrically connecting the referential track to the other one of the first and second conductive area of the first bitcell by means of a second one of the conductive vias of the first bitcell, wherein the second conductive via of the first bitcell is connected to one of the plurality of zones of said other one of the first and second conductive area of the first bitcell, or the second logic value is programmed into the first bitcell by electrically isolating the bitline track from said one of the first and second conductive area of the first bitcell and by electrically isolating the referential track from said other one of the first and second conductive area of the first bitcell,
   wherein either the first logic value is programmed into the second bitcell by electrically connecting the bitline track to one of the first and second conductive area of the second bitcell by means of a first one of the conductive vias of the second bitcell, wherein the first conductive via of the second bitcell is connected to one of a plurality of zones of said one of the first and second conductive area of the second bitcell, and by electrically connecting the referential track to the other one of the first and second conductive area of the second bitcell by means of a second one of the conductive vias of the second bitcell, wherein the second conductive via of the second bitcell is connected to one of a plurality of zones of said other one of the first and second conductive area of the second bitcell, wherein the respective one of the zones of the first and second conductive area is selected in dependence on the programmed logic value of the first bitcell, or wherein the second logic value is programmed into the second bitcell by electrically isolating the bitline track from said one of the first and second conductive area of the second bitcell and by electrically isolating the referential track from said other one of the first and second conductive area of the second bitcell.

2. The ROM structure as claimed in claim 1,
wherein, when programming the first bitcell with the first logic value, the zone of said one of the first and second conductive area of the first bitcell to which the first conductive via of the first bitcell is connected, is selected from the plurality of the zones of said one of the first and second conductive area of the first bitcell in dependence on operating the ROM array as flipped ROM array in multibank instance or as non-flipped ROM array in multibank instance,
wherein, when programming the first bitcell with the first logic value, the zone of said other one of the first and second conductive area of the first bitcell to which the second conductive via of the first bitcell is connected, is selected from the plurality of the zones of said other one of the first and second conductive area of the first bitcell in dependence on operating the ROM array as flipped ROM array in multibank instance or as non-flipped ROM array in multibank instance.

3. The ROM structure as claimed in claim 1,
wherein, when programming the second bitcell with the first logic value, the zone of said one of the first and second conductive area of the second bitcell to which the first conductive via of the second bitcell is connected is selected from the plurality of the zones of said one of the first and second conductive area of the second bitcell in dependence on the respective selected zone of the first and second conductive area of the first bitcell,
wherein, when programming the second bitcell with the first logic value, the zone of said other one of the first and second conductive area of the second bitcell to which the second conductive via of the second bitcell is connected is selected from the plurality of the zones of said other one of the first and second conductive area of the second bitcell in dependence on the respective selected zone of the first and second conductive area of the first bitcell.

4. The ROM structure as claimed in claim 3,
wherein, when programming the second bitcell with the first logic value, the zone of said one of the first and second conductive area of the second bitcell to which the first conductive via of the second bitcell is connected is selected from the plurality of the zones of said one of the first and second conductive area of the second bitcell in dependence on operating the ROM array as flipped ROM array in multibank instance or as non-flipped ROM array in multibank instance,
wherein, when programming the second bitcell with the first logic value, the zone of said other one of the first and second conductive area of the second bitcell to which the second conductive via of the second bitcell is connected is selected from the plurality of the zones of said other one of the first and second conductive area of the second bitcell in dependence on operating the ROM array as flipped ROM array in multibank instance or as non-flipped ROM array in multibank instance.

5. The ROM structure as claimed in claim 1,
wherein, when programming the first bitcell with the first logic value, one of a first zone of the first conductive area of the first bitcell to which the first conductive via of the first bitcell is connected and one of a first zone of the second conductive area of the first bitcell to which the first conductive via of the first bitcell is connected is selected in dependence on operating the ROM array as flipped ROM array in multibank instance or as non-flipped ROM array in multibank instance,
wherein, when programming the first bitcell with the first logic value, one of a second zone of the first conductive area of the first bitcell to which the second conductive via of the first bitcell is connected and a second zone of the second conductive area of the first bitcell to which the second conductive via of the first bitcell is connected is selected in dependence on operating the ROM array as flipped ROM array in multibank instance or as non-flipped ROM array in multibank instance.

6. The ROM structure as claimed in claim 1,
wherein the ROM array comprises a third one of the plurality of bitcells being arranged in said one of the columns and a third one of the rows of the ROM array being arranged directly adjacent to the second one of the rows of the ROM array,
wherein either the first logic value is programmed into the third bitcell by electrically connecting the bitline track to one of the first and second conductive area of the third bitcell by means of a first one of the conductive vias of the third bitcell, wherein the first conductive via of the third bitcell is connected to one of a plurality of zones of said one of the first and second conductive area of the third bitcell, and by electrically connecting the referential track to the other one of the first and second conductive area of the third bitcell by means of a second one of the conductive vias of the third bitcell, wherein the second conductive via of the third bitcell is connected to one of a plurality of zones of said other one of the first and second conductive area of the third bitcell, or the second logic value is programmed into the third bitcell by electrically isolating the bitline track from said one of the first and second conductive area of the third bitcell and by electrically isolating the referential track from said other one of the first and second conductive area of the third bitcell,
wherein said zone of said one of the first and second conductive area of the third bitcell to which the first conductive via of the third bitcell is connected is selected from the plurality of the zones of said one of the first and second conductive area of the third bitcell in dependence on the respective selected zone of the first conductive area of the first and the second bitcell and the respective selected zone of the second conductive area of the first and the second bitcell.

7. The ROM structure as claimed in claim 6,
wherein, when programming the ROM array, the first bitcell is programmed before programming the second bitcell and the second bitcell is programmed directly subsequently to the first bitcell,
wherein, when programming the ROM array, the second bitcell is programmed before programming the third bitcell and the third bitcell is programmed directly subsequently to the second bitcell.

8. The ROM structure as claimed in claim 6,
wherein, when programming the third bitcell with the first logic value, the zone of said one of the first and second conductive area of the third bitcell to which the first conductive via of the third bitcell is connected is selected from the plurality of the zones of said one of the first and second conductive area of the third bitcell in dependence on operating the ROM array as flipped ROM array in multibank instance or as non-flipped ROM array in multibank instance, wherein, when programming the third bitcell with the first logic value, the zone of said other one of the first and second conductive area of the third bitcell to which the second conductive via of the third bitcell is connected is selected from the plurality of the zones of said other one of the first and second conductive area of the third bitcell in dependence on operating the ROM array as flipped ROM array in multibank instance or as non-flipped ROM array in multibank instance.

9. The ROM structure as claimed in claim 6,
wherein, when programming one of the second and third bitcell with the first logic value, a first zone of the first conductive area or one of a first and a second zone of the second conductive area of the respective second and third bitcell is respectively selected to be connected to the respective first conductive via of the second and third bitcell, when the ROM array is operated as non-flipped ROM array in multibank instance,
wherein, when programming the second and third bitcell with the first logic value, a second zone of the first conductive area or one of a third and fourth zone of the second conductive area of the respective second and third bitcell is respectively selected to be connected to the respective second conductive via of the second and third bitcell, when the ROM array is operated as non-flipped ROM array in multibank instance.

10. The ROM structure as claimed in claim 6,
wherein, when programming the second and third bitcell with the first logic value, one of a first and second zone of the first conductive area or a first zone of the second conductive area of the respective second and third bitcell is selected to be respectively connected to the respective first conductive via of the second and third bitcell, when the ROM array is operated as flipped ROM array in multibank instance,
wherein, when programming the second and third bitcell with the first logic value, one of a third and fourth zone of the first conductive area or a second zone of the second conductive area of the respective second and third bitcell is selected to be respectively connected to the respective second conductive via of the second and third bitcell, when the ROM array is operated as flipped ROM array in multibank instance.

11. The ROM structure as claimed in claim 1,
wherein, when programming the second bitcell with the first logic value, a pair of the zones of the first and second conductive area of the second bitcell to be connected to the first and second conductive via of the second bitcell is selected from a total of four pairs of the zones, when the ROM array is operated as flipped ROM array in multibank instance,
wherein, when programming the second bitcell with the first logic value, a pair of the zones of the first and second conductive area of the second bitcell to be connected to the first and second conductive via of the second bitcell is selected from a total of four other pairs of the zones, when the ROM array is operated as non-flipped ROM array in multibank instance.

12. The ROM structure as claimed in claim 11,
wherein, when programming the third bitcell with the first logic value, a pair of zones of the first and second conductive area of the third bitcell to be connected to the first and second conductive via of the third bitcell is selected from the total of four pairs of the zones, when the ROM array is operated as flipped ROM array in multibank instance,
wherein, when programming the third bitcell with the first logic value, a pair of the zones of the first and second conductive area of the third bitcell to be connected to the first and second conductive via of the third bitcell is selected from the total of four other pairs of the zones, when the ROM array is operated as non-flipped ROM array in multibank instance.

13. The ROM structure as claimed in claim 1,
wherein the ROM array is configured as a ROM designed in 16 nm FinFET technology.

14. A read only memory (ROME compiler which, when executed by a computer causes the computer to generate a ROM structure, the ROM compiler comprising:
code to receive the ROM contents, and
code to generate the ROM structure for the received ROM contents,
wherein the ROM structure comprises:
bitcells arranged in rows and columns of a ROM array, each bitcell comprising one transistor,
the transistors of the bitcells in one of the columns sharing source regions and drain regions of the bitcells alternatively,
each column having a bitline track and a referential track on a metal layer running above all source regions and drain regions, and
conductive vias connecting bitline track and referential track to selected source regions and drain regions,
wherein each of the bitcells programmed as having a first logic value has two possible configurations: the source region of the respective bitcell connected to the bitline track and the drain region of the respective bitcell connected to the referential track, and the source region of the respective bitcell connected to the referential track and the drain region of the respective bitcell connected to the bitline track,
wherein each of the bitcells programmed as having a second logic value has four possible configurations: the source region of the respective bitcell connected to the bitline track or the referential track and the drain region of the respective bitcell floating, the source region of the respective bitcell floating and the drain region of the respective bitcell connected to the bitline track or the referential track, both of the source region and the drain of the respective bitcell region floating, and both of the source region and the drain region of the respective bitcell connected to the bitline track or the referential track,
wherein each of the bitcells comprises a first conductive area, and a second conductive area, wherein the first conductive area is electrically connected to the drain region of the transistor of the respective bitcell and the second conductive area is electrically connected to the source region of the transistor of the respective bitcell, wherein each of the bitcells is configured to be programmed with one of the first and the second logic value, wherein the ROM array comprises a first one of the bitcells being arranged in one of the columns and a first one of the rows of the ROM array being arranged in said one of the columns and a second one of the rows being different from the first row,
wherein either the first logic value is programmed into the first bitcell by electrically connecting the bitline track to one of the first and second conductive area of the first bitcell by means of a first one of the conductive vias of the first bitcell, wherein the first conductive via of the first bitcell is connected to one of a plurality of zones of said one of the first and second conductive area of the first bitcell, and by electrically connecting the referential track to the other one of the first and second conductive area of the first bitcell by means of a second one of the conductive vias of the first bitcell, wherein the second conductive via of the first bitcell is connected to one of the plurality of zones of said other one of the first and second conductive area of the first bitcell, or the second logic value is programmed into the first bitcell by electrically isolating the bitline track from said one of the first and second conductive area of the first bitcell and by electrically isolating the referential track from said other one of the first and second conductive area of the first bitcell, wherein either the first logic value is programmed into the second bitcell by electrically connecting the bitline track to one of the first and second conductive area of the second bitcell by means of a first one of the conductive vias of the second bitcell, wherein the first conductive via of the second bitcell is connected to one of a plurality of zones of said one of the first and second conductive area of the second bitcell, and by electrically connecting the referential track to the other one of the first and second conductive area of the second bitcell by means of a second one of the conductive vias of the second bitcell, wherein the second conductive via of the second bitcell is connected to one of a plurality of zones of said other one of the first and second conductive area of the second bitcell, wherein the respective one of the zones of the first and second conductive area is selected in dependence on the programmed logic value of the first bitcell, or wherein the second logic value is programmed into the second bitcell by electrically isolating the bitline track from said one of the first and second conductive area of the second bitcell and by electrically isolating the referential track from said other one of the first and second conductive area of the second bitcell.

15. The ROM compiler as claimed in claim 14,
wherein, when programming the first bitcell with the first logic value, the zone of said one of the first and second conductive area of the first bitcell to which the first conductive via of the first bitcell is connected, is selected from the plurality of the zones of said one of the first and second conductive area of the first bitcell in dependence on operating the ROM array as flipped ROM array in multibank instance or as non-flipped ROM array in multibank instance, wherein, when programming the first bitcell with the first logic value, the zone of said other one of the first and second conductive area of the first bitcell to which the second conductive via of the first bitcell is connected, is selected from the plurality of the zones of said other one of the first and second conductive area of the first bitcell in dependence on operating the ROM array as flipped ROM array in multibank instance or as non-flipped ROM array in multibank instance.

16. The ROM compiler as claimed in claim 14,
wherein, when programming the second bitcell with the first logic value, the zone of said one of the first and second conductive area of the second bitcell to which the first conductive via of the second bitcell is connected is selected from the plurality of the zones of said one of the first and second conductive area of the second bitcell in dependence on the respective selected zone of the first and second conductive area of the first bitcell, wherein, when programming the second bitcell with the first logic value, the zone of said other one of the first and second conductive area of the second bitcell to which the second conductive via of the second bitcell is connected is selected from the plurality of the zones of said other one of the first and second conductive area of the second bitcell in dependence on the respective selected zone of the first and second conductive area of the first bitcell.

17. The ROM compiler as claimed in claim 14,
wherein, when programming the second bitcell with the first logic value, the zone of said one of the first and second conductive area of the second bitcell to which the first conductive via of the second bitcell is connected is selected from the plurality of the zones of said one of the first and second conductive area of the second bitcell in dependence on operating the ROM array as flipped ROM array in multibank instance or as non-flipped ROM array in multibank instance, wherein, when programming the second bitcell with the first logic value, the zone of said other one of the first and second conductive area of the second bitcell to which the second conductive via of the second bitcell is connected is selected from the plurality of the zones of said other one of the first and second conductive area of the second bitcell in dependence on operating the ROM array as flipped ROM array in multibank instance or as non-flipped ROM array in multibank instance.

18. The ROM compiler as claimed in claim 14,
wherein, when programming the first bitcell with the first logic value, one of a first zone of the first conductive area of the first bitcell to which the first conductive via of the first bitcell is connected and one of a first zone of the second conductive area of the first bitcell to which the first conductive via of the first bitcell is connected is selected in dependence on operating the ROM array as flipped ROM array in multibank instance or as non-flipped ROM array in multibank instance, wherein, when programming the first bitcell with the first logic value, one of a second zone of the first conductive area of the first bitcell to which the second conductive via of the first bitcell is connected and a second zone of the second conductive area of the first bitcell to which the second conductive via of the first bitcell is connected is selected in dependence on operating the ROM array as flipped ROM array in multibank instance or as non-flipped ROM array in multibank instance.

19. The ROM structure as claimed in claim 14,
wherein the ROM array comprises a third one of the plurality of bitcells being arranged in said one of the columns and a third one of the rows of the ROM array being arranged directly adjacent to the second one of the rows of the ROM array, wherein either the first logic value is programmed into the third bitcell by electrically connecting the bitline track to one of the first and second conductive area of the third bitcell by means of a first one of the conductive vias of the third bitcell, wherein the first conductive via of the third bitcell is connected to one of a plurality of zones of said one of the first and second conductive area of the third bitcell, and by electrically connecting the referential track to the other one of the first and second conductive area of the third bitcell by means of a second one of the conductive vias of the third bitcell, wherein the second conductive via of the third bitcell is connected to one of a plurality of zones of said other one of the first and second conductive area of the third bitcell, or the second logic value is programmed into the third bitcell by electrically isolating the bitline track from said one of the first and second conductive area of the third bitcell and by electrically isolating the referential track from said other one of the first and second conductive area of the third bitcell, wherein said zone of said one of the first and second conductive area of the third bitcell to which the first conductive via of the third bitcell is connected is selected from the plurality of the zones of said one of the first and second conductive area of the third bitcell in dependence on the respective selected zone of the first conductive area of the first and the second bitcell and the respective selected zone of the second conductive area of the first and the second bitcell.

20. The ROM compiler as claimed in claim 19,
wherein, when programming the ROM array, the first bitcell is programmed before programming the second bitcell and the second bitcell is programmed directly subsequently to the first bitcell,
wherein, when programming the ROM array, the second bitcell is programmed before programming the third bitcell and the third bitcell is programmed directly subsequently to the second bitcell.

21. The ROM compiler as claimed in claim 19,
wherein, when programming the third bitcell with the first logic value, the zone of said one of the first and second conductive area of the third bitcell to which the first conductive via of the third bitcell is connected is selected from the plurality of the zones of said one of the first and second conductive area of the third bitcell in dependence on operating the ROM array as flipped ROM array in multibank instance or as non-flipped ROM array in multibank instance,
wherein, when programming the third bitcell with the first logic value, the zone of said other one of the first and second conductive area of the third bitcell to which the second conductive via of the third bitcell is connected is selected from the plurality of the zones of said other one of the first and second conductive area of the third bitcell in dependence on operating the ROM array as flipped ROM array in multibank instance or as non-flipped ROM array in multibank instance.

22. The ROM compiler as claimed in claim 19,
wherein, when programming one of the second and third bitcell with the first logic value, a first zone of the first conductive area or one of a first and a second zone of the second conductive area of the respective second and third bitcell is respectively selected to be connected to the respective first conductive via of the second and third bitcell, when the ROM array is operated as non-flipped ROM array in multibank instance, wherein, when programming the second and third bitcell with the first logic value, a second zone of the first conductive area or one of a third and fourth zone of the second conductive area of the respective second and third bitcell is respectively selected to be connected to the respective second conductive via of the second and third bitcell, when the ROM array is operated as non-flipped ROM array in multibank instance.

23. The ROM compiler as claimed in claim 19,
wherein, when programming the second and third bitcell with the first logic value, one of a first and second zone of the first conductive area or a first zone of the second conductive area of the respective second and third bitcell is selected to be respectively connected to the respective first conductive via of the second and third bitcell, when the ROM array is operated as flipped ROM array in multibank instance,
wherein, when programming the second and third bitcell with the first logic value, one of a third and fourth zone of the first conductive area or a second zone of the second conductive area of the respective second and third bitcell is selected to be respectively connected to the respective second conductive via of the second and third bitcell, when the ROM array is operated as flipped ROM array in multibank instance.

24. The ROM compiler as claimed in claim 19,
wherein, when programming the third bitcell with the first logic value, a pair of zones of the first and second conductive area of the third bitcell to be connected to the first and second conductive via of the third bitcell is selected from the total of four pairs of the zones, when the ROM array is operated as flipped ROM array in multibank instance,
wherein, when programming the third bitcell with the first logic value, a pair of the zones of the first and second conductive area of the third bitcell to be connected to the first and second conductive via of the third bitcell is selected from the total of four other pairs of the zones, when the ROM array is operated as non-flipped ROM array in multibank instance.

25. The ROM compiler as claimed in claim 14,
wherein, when programming the second bitcell with the first logic value, a pair of the zones of the first and second conductive area of the second bitcell to be connected to the first and second conductive via of the second bitcell is selected from a total of four pairs of the zones, when the ROM array is operated as flipped ROM array in multibank instance,
wherein, when programming the second bitcell with the first logic value, a pair of the zones of the first and second conductive area of the second bitcell to be connected to the first and second conductive via of the second bitcell is selected from a total of four other pairs of the zones, when the ROM array is operated as non-flipped ROM array in multibank instance.

* * * * *